US008884293B2

(12) United States Patent
Terai et al.

(10) Patent No.: US 8,884,293 B2
(45) Date of Patent: Nov. 11, 2014

(54) DISPLAY DEVICE, METHOD OF MANUFACTURING THE SAME, AND ELECTRONIC UNIT

(75) Inventors: Yasuhiro Terai, Kanagawa (JP); Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/617,869

(22) Filed: Sep. 14, 2012

(65) Prior Publication Data

US 2013/0087795 A1    Apr. 11, 2013

(30) Foreign Application Priority Data

Oct. 7, 2011    (JP) .................. 2011-222879

(51) Int. Cl.
*H01L 29/10*    (2006.01)
*H01L 29/12*    (2006.01)
*H01L 21/00*    (2006.01)
*H01L 27/12*    (2006.01)

(52) U.S. Cl.
CPC .......... *H01L 27/124* (2013.01); *H01L 27/1225* (2013.01)
USPC ................. 257/59; 257/43; 438/158; 438/795

(58) Field of Classification Search
CPC ........................ H01L 27/124; H01L 27/12225
USPC .................... 257/59, 43; 438/795, 34
See application file for complete search history.

(56) References Cited

U.S. PATENT DOCUMENTS

| 2001/0045928 A1* | 11/2001 | Zavracky et al. ................ 345/88 |
| 2006/0208977 A1* | 9/2006 | Kimura ............................ 345/76 |
| 2006/0238135 A1* | 10/2006 | Kimura ....................... 315/169.3 |
| 2007/0072439 A1* | 3/2007 | Akimoto et al. ............... 438/795 |
| 2008/0106191 A1* | 5/2008 | Kawase ......................... 313/504 |
| 2008/0258143 A1* | 10/2008 | Kim et al. ....................... 257/43 |

FOREIGN PATENT DOCUMENTS

| JP | 2007-519256 | 7/2007 |
| JP | 2008-085048 | 4/2008 |
| JP | 2010-098280 | 4/2010 |

OTHER PUBLICATIONS

Cetin Kilic and Alex Zunger, "N-type doping of oxides by hydrogen," Applied Physics Letters, vol. 81, No. 1, pp. 73-75, Jul. 1, 2002. (3 pages).

Japan Society for the Promotion of Science, The 166th Committee on Photonic and Electronic Oxide ed., "Technology of Transparent Conductive Layer." (2 pages).

* cited by examiner

*Primary Examiner* — Long K Tran
*Assistant Examiner* — Dzung Tran
(74) *Attorney, Agent, or Firm* — K&L Gates LLP

(57) ABSTRACT

A display device includes: a thin film transistor; and a wiring layer; the thin film transistor including a control electrode, a semiconductor layer facing the control electrode, a first electrode made of a light transmissive material and electrically connected to the semiconductor layer, and a second electrode including a metal film having resistance lower than that of the light transmissive material, the second electrode being electrically connected to each of the semiconductor layer and the wiring layer, wherein a difference in ionization tendency between a material configuring the metal film and a conductive material configuring a part or whole of the wiring layer is smaller than a difference in ionization tendency between the light transmissive material and the conductive material.

13 Claims, 11 Drawing Sheets

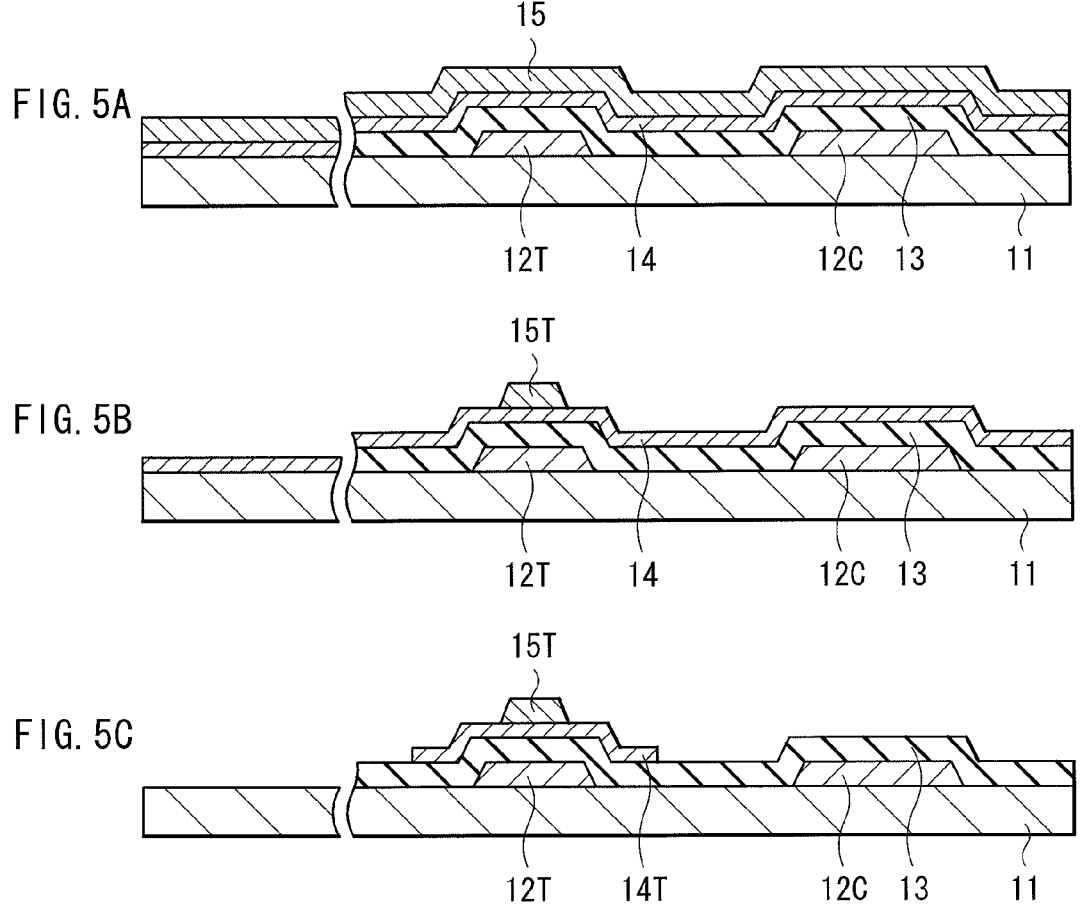

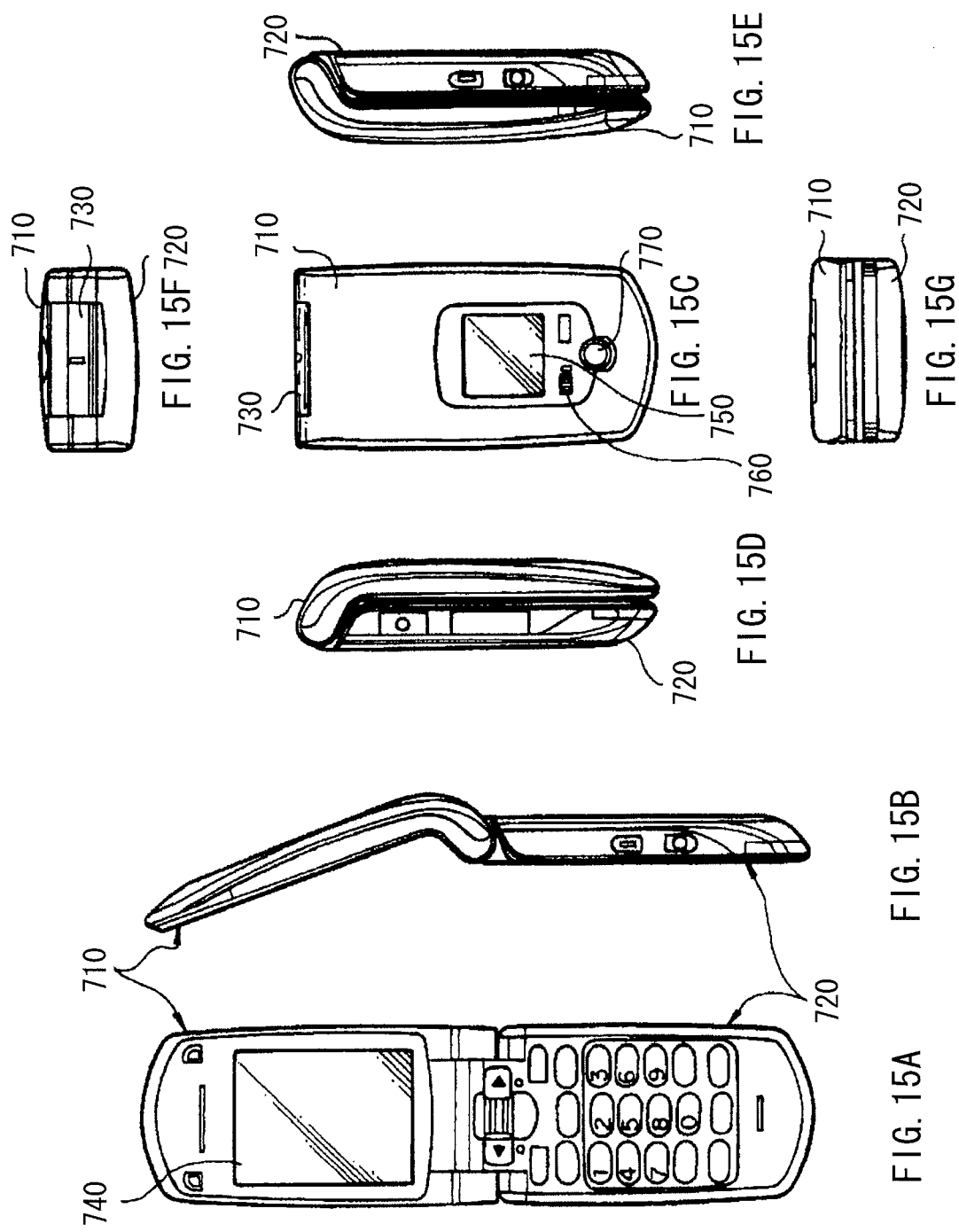

DISPLAY DEVICE, METHOD OF MANUFACTURING THE SAME, AND ELECTRONIC UNIT

BACKGROUND

The present application relates to a display device including a thin film transistor (TFT) and a wiring layer, a method of manufacturing the display device, and an electronic unit.

In recent years, a perfectly transparent (light transmissive) display is desired, and a transparent conductive oxide film of ITO (indium-tin-oxide) or the like is used as an electrode of a transistor. Since oxide semiconductors containing zinc (Zn), indium (In), gallium (Ga), or the like offer favorable contact with transparent conductive oxide films, a TFT in which such oxide semiconductors are used as a semiconductor layer is under development (for example, Japanese Unexamined Patent Application Publication No. 2010-98280).

Compared to TFTs using amorphous silicon (a-Si:H), a TFT using an oxide semiconductor offers higher electron mobility, and has excellent electric characteristics. In addition, a TFT using an oxide semiconductor is expected to offer high mobility even in the case where it is formed under a cold condition at around room temperature, and therefore, such a TFT using an oxide semiconductor is actively developed in the field of electronic devices such as a light-emitting device and a transparent conductive layer, other than a TFT (for example, Japanese Unexamined Patent Application Publication (Published Japanese Translation of PCT Application) No. 2007-519256; Japanese Unexamined Patent Application Publication No. 2008-85048; Cetin Kilic, et al., "n-type doping of oxides by hydrogen", Applied Physics Letters, Jul. 1, 2002, vol. 81, No 1, pp 73-75; and Japan Society for the Promotion of Science, The 166th Committee on Photonic and Electronic Oxide ed., "Technology of Transparent Conductive Layer" pp 150-152).

As a TFT using an oxide semiconductor, a bottom-gate type TFT and a top-gate type TFT have been reported. The structure of the bottom-gate type is similar to that of a bottom-gate type amorphous silicon TFT which is currently used in liquid crystal displays, and therefore the manufacturing process of the amorphous silicon TFT is applicable. TFTs of the bottom-gate type include on a substrate thereof a gate electrode, a gate insulating film, a semiconductor thin film, and a source/drain electrode in this order, and one of the source/drain electrode is connected to a wiring layer such as a scan line and a signal line. Since the resistance of a transparent conductive oxide film is high, it is difficult to use the transparent conductive oxide film as a main wiring layer. Consequently, a low-resistance metal such as aluminum (Al) is used as the above-mentioned wiring layer.

SUMMARY

However, such a wiring layer made of a low-resistance metal and a source/drain electrode made of ITO greatly differ from each other in ionization tendency. Therefore, at the time of forming the source/drain electrode, if the wiring layer and the source/drain electrode are immersed in chemical solution such as a resist stripping solution in a state where they are electrically connected, then there is an issue that corrosion (electrolytic corrosion) occurs at the wiring (Al) having a greater ionization tendency, and the resistance of the wiring becomes unstable.

It is desirable to provide a display device having stable electrical characteristics in which occurrence of electrolytic corrosion of an electrode of a TFT and a wiring layer is suppressed, a method of manufacturing the display device, and an electronic unit.

According to an embodiment of the present application, there is provided a display device including: a thin film transistor; and a wiring layer; the thin film transistor including a control electrode, a semiconductor layer facing the control electrode, a first electrode made of a light transmissive material and electrically connected to the semiconductor layer, and a second electrode including a metal film having resistance lower than that of the light transmissive material, the second electrode being electrically connected to each of the semiconductor layer and the wiring layer, wherein a difference in ionization tendency between a material configuring the metal film and a conductive material configuring a part or whole of the wiring layer is smaller than a difference in ionization tendency between the light transmissive material and the conductive material.

According to an embodiment of the present application, there is provided an electronic unit with a display device, the display device including: a thin film transistor; and a wiring layer; the thin film transistor including a control electrode, a semiconductor layer facing the control electrode, a first electrode made of a light transmissive material and electrically connected to the semiconductor layer, and a second electrode including a metal film having resistance lower than that of the light transmissive material, the second electrode being electrically connected to each of the semiconductor layer and the wiring layer, wherein a difference in ionization tendency between a material configuring the metal film and a conductive material configuring a part or whole of the wiring layer is smaller than a difference in ionization tendency between the light transmissive material and the conductive material.

According to an embodiment of the present application, there is provided a method of manufacturing a display device, the method including forming a thin film transistor and a wiring layer, the forming of a thin film transistor including: providing a control electrode and a semiconductor layer facing the control electrode; providing a first electrode made of a light transmissive material and electrically connected to the semiconductor layer; and forming a second electrode by forming a metal film having resistance lower than that of the light transmissive material such that the metal film is electrically connected to the semiconductor layer and the wiring layer, and thereafter patterning the metal film, wherein a difference in ionization tendency between a material configuring the metal film and a conductive material configuring a part or whole of the wiring layer is smaller than a difference in ionization tendency between the light transmissive material and the conductive material.

In the display device (electronic unit) or the method of manufacturing the display device according to the embodiments of the present application, the difference in ionization tendency between the metal film of the second electrode and the conductive material of the wiring layer is smaller than the difference in ionization tendency between the light transmissive material and the conductive material. As a result, in comparison with the case where the second electrode and the first electrode have the same configuration, electrolytic corrosion between the second electrode and the wiring layer is reduced.

In the display device, the method of manufacturing the display device, and the electronic unit according to the embodiments of the present application, since the second electrode includes the metal film, it is possible to prevent electrolytic corrosion between the second electrode and the wiring layer. Consequently, it is possible to achieve stable electrical characteristics.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the application.

FIGS. 5A to 5C are sectional views showing processes subsequent to FIG. 4C.

FIG. 15A is a front view showing an unfolded state of application example 5, FIG. 15B is a side view thereof, FIG. 15C is a front view of a folded state, FIG. 15D is a left side view, FIG. 15E is a right side view, FIG. 15F is a top view, and FIG. 15G is a bottom view.

DETAILED DESCRIPTION

Figure 1A:
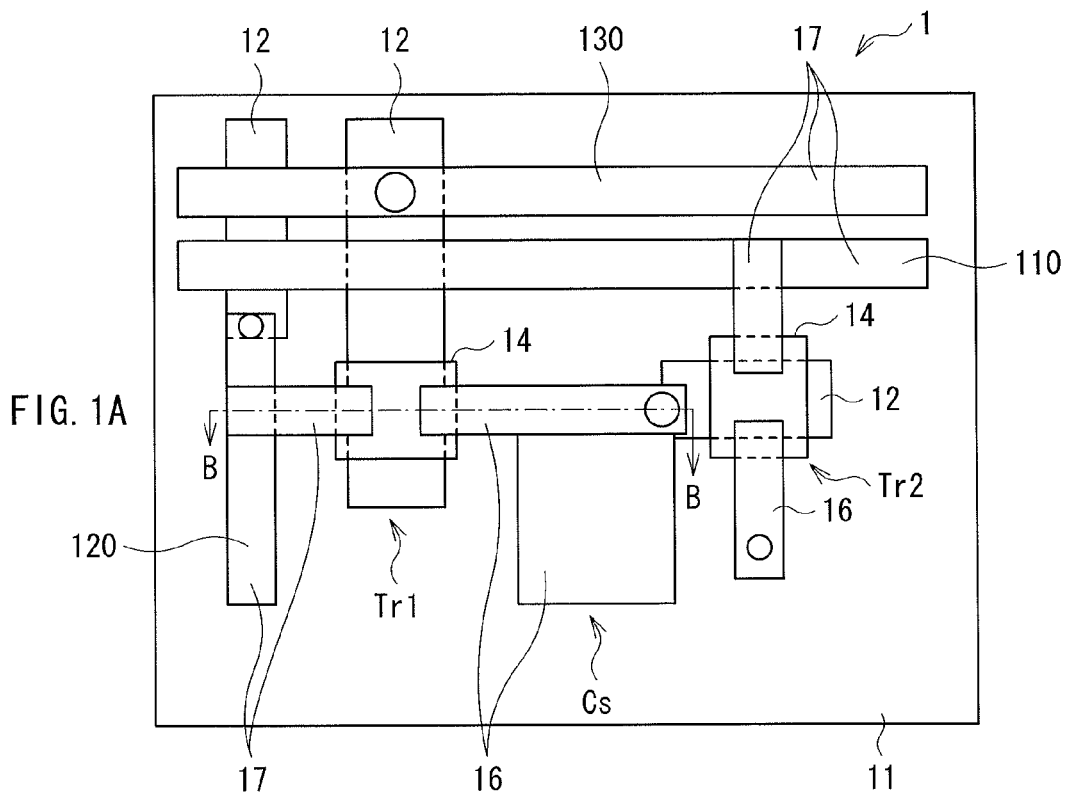
FIGS. 1A and 1B are views showing a configuration of a display device according to an embodiment of the present disclosure.
Figure 1B:
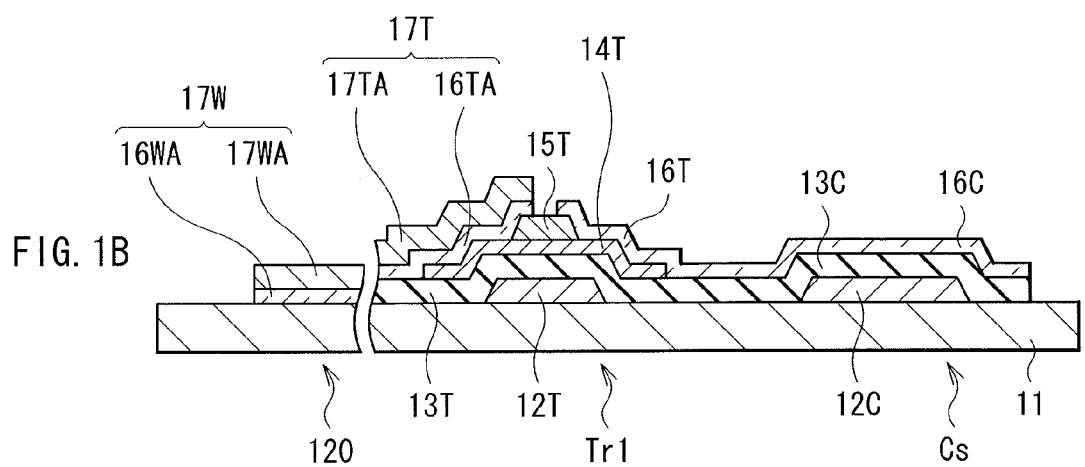

With reference to the figures, an embodiment of the present application will be described in detail below. It is to be noted that, description will be made in the following order.
1. Embodiment (Exemplary Case Where Second Electrode Includes Metal Film)
2. Application Example Embodiment FIG. 1A shows a plan configuration of a display device (display device 1) according to an embodiment of the present disclosure, and FIG. 1B shows a part of a cross sectional configuration taken along line B-B of FIG. 1A. The display device 1 includes, on a substrate 11, a plurality of organic EL devices disposed in matrix, and various driving circuits used to drive the organic EL devices. A plurality of wirings (a power line 110, a signal line 120, and a scan line 130) connected to the driving circuits are disposed in a row direction and a column direction. The display device 1 is a display having high light transmissivity (transparent display), and wirings of a first conducting film 16 made of a light transmissive material are provided all over a large portion of a display region. On the other hand, in order to ensure electrical stability, the power line 110, the signal line 120, and the scan line 130 have a configuration in which a second conducting film 17 made of a metal lower in resistance than the first conducting film 16 is laminated on the first conducting film 16. The power line 110, the signal line 120, and the scan line 130 supply a power voltage, an image signal from a signal line driving circuit, and a scanning signal from a scan line drive circuit, respectively.

The display device 1 includes transistors Tr1 and Tr2 as thin film transistors, and a capacitor Cs is provided in a region between the transistors Tr1 and Tr2. A source electrode 17T (second electrode) and a gate electrode 12T (control electrode) of the transistor Tr1 are electrically connected to the signal line 120 and the scan line 130, respectively.
(Transistor Tr1)

The transistor Tr1 has a structure of a bottom-gate type (inversely-staggered structure), and includes, from the substrate 11 side, the gate electrode 12T, a gate insulating film 13T, a semiconductor layer 14T, a drain electrode 16T (first electrode), and the source electrode 17T in this order, for example.

The substrate 11 is configured of a glass substrate, a plastic film, or the like. Examples of the plastic material include PET (polyethylene terephthalate) and PEN (polyethylene naphthalate). If it is possible to form the semiconductor layer 14T without heating the substrate 11 by the sputtering method or the like, then it is also possible to use an inexpensive plastic film as the substrate 11.

The gate electrode 12T has a role of applying a gate voltage to the transistor Tr1, and, with this gate voltage, controlling a career density in the semiconductor layer 14T. The gate electrode 12T is configured of a third conducting film 12, and is provided in a selective region on the substrate 11. The third conducting film 12 is made of any one of metals including platinum (Pt), titanium (Ti), ruthenium (Ru), molybdenum (Mo), copper (Cu), tungsten (W), nickel (Ni), aluminum (Al), and tantalum (Ta), or their alloys. The third conducting film 12 may be a transparent conductive thin film made of indium tin oxide (ITO), indium zinc oxide (IZO), zinc oxide (ZnO), or the like.

The gate insulating film 13T is provided between the gate electrode 12T and the semiconductor layer 14T, and is configured to have a thickness ranging from 50 nm to 1 μm, for example. The gate insulating film 13T includes an insulating film including one or more of a silicon oxide film, a silicon nitride film, a silicon oxynitride film, a hafnium oxide film, an aluminum oxide film, an aluminum nitride film, a tantalum oxide film, a zirconium oxide film, a hafnium oxynitride film, a hafnium silicon oxynitride film, an aluminum oxynitride film, a tantalum oxynitride film, and a zirconium oxynitride film, for example. The gate insulating film 13T may have a single layer structure or a laminated structure including two or more kinds of layers. When the gate insulating film 13T has a laminated structure including two or more kinds of layers, it is possible to improve interfacial surface characteristics between the gate insulation film 13T and the semiconductor layer 14T, and to suppress the entry of impurities to the semiconductor layer 14T from outside air.

The semiconductor layer 14T is provided on the gate insulating film 13T in a form of an island, and a channel region is formed at a location facing the gate electrode 12T between the drain electrode 16T and the source electrode 17T. The semiconductor layer 14T is configured of an oxide semiconductor containing, as a main component, oxides of one or more elements including indium (In), gallium (Ga), zinc (Zn), tin (Sn), aluminum (Al), and titanium (Ti). Specifically, examples of such an oxide semiconductor include indium gallium zinc oxide (IGZO), zinc oxide, aluminum doped zinc oxide (AZO), and gallium doped zinc oxide (GZO) which are transparent oxide semiconductors each containing zinc oxide as a main component. In consideration of oxygen supply efficiency of annealing in a manufacturing process, the thickness of the semiconductor layer 14T is preferably 5 nm to 100 nm, for example. While the semiconductor layer 14T may be in an amorphous state or a crystalline state, when it is in a crystalline state, its tolerance against etching solution becomes high, and application to device structure formation becomes easy. The material of the semiconductor layer 14T is not limited to the oxide semiconductor materials, and the semiconductor layer 14T may be formed of other materials.

A channel protective layer 15T is provided on the semiconductor layer 14T, and is configured to prevent damage of the channel (the semiconductor layer 14T) at the time of forming the drain electrode 16T and the source electrode 17T. The channel protective layer 15T is configured of a silicon oxide film or a silicon nitride film, for example.

The drain electrode 16T and the source electrode 17T are provided on the semiconductor layer 14T and the channel protective layer 15T spaced from each other, and electrically connected to the semiconductor layer 14T. The drain electrode 16T is configured of the first conducting film 16. The first conducting film 16 is made of a light transmissive oxide containing, for example, indium (In) or zinc (Zn) as a main component, and specifically, the first conducting film 16 is a transparent conductive oxide film made of ITO, indium zinc oxide (IZO), zinc oxide (ZnO), or the like.

The source electrode 17T includes a transparent electrode layer 16TA and a low-resistance electrode layer 17TA (metal film) laminated on the transparent electrode layer 16TA. The transparent electrode layer 16TA and the low-resistance electrode layer 17TA are configured of the first conducting film 16 and the second conducting film 17, respectively. The second conducting film 17 is a low-resistance metal film such as an aluminum (Al) film and a film made of an aluminum alloy. The transparent electrode layer 16TA and the low-resistance electrode layer 17TA are configured to have substantially the same planar dimension, and provided at the same position in planar view. In other words, the transparent electrode layer 16TA is covered with the low-resistance electrode layer 17TA, and the transparent electrode layer 16TA is not exposed on the surface of the source electrode 17T. Although details will be described later, in the present embodiment, the source electrode 17T is provided with the low-resistance electrode layer 17TA on its surface, and as a result, occurrence of electrolytic corrosion between the source electrode 17T and the signal line 120 (wiring layer 17W) is suppressed.

A interfacial surface layer (not shown) made of, for example, molybdenum (Mo), titanium (Ti), or the like may be provided between the transparent electrode layer 16TA and the low-resistance electrode layer 17TA to increase the conductivity therebetween. In addition, if a protective layer made of molybdenum, titanium, molybdenum nitride, or titanium nitride is provided also on the low-resistance electrode layer 17TA, then electrolytic corrosion is prevented more securely, and further, it is possible to prevent the surface of the source electrode 17T from being oxidized. The source electrode 17T includes, for example, from the semiconductor layer 14T side, the transparent electrode layer 16TA having a thickness of 5 nm to 300 nm, the interfacial surface layer having a thickness of 100 nm, the low-resistance electrode layer 17TA having a thickness of 500 nm, and the protective layer having a thickness of 50 nm, in this order.

Figure 2:
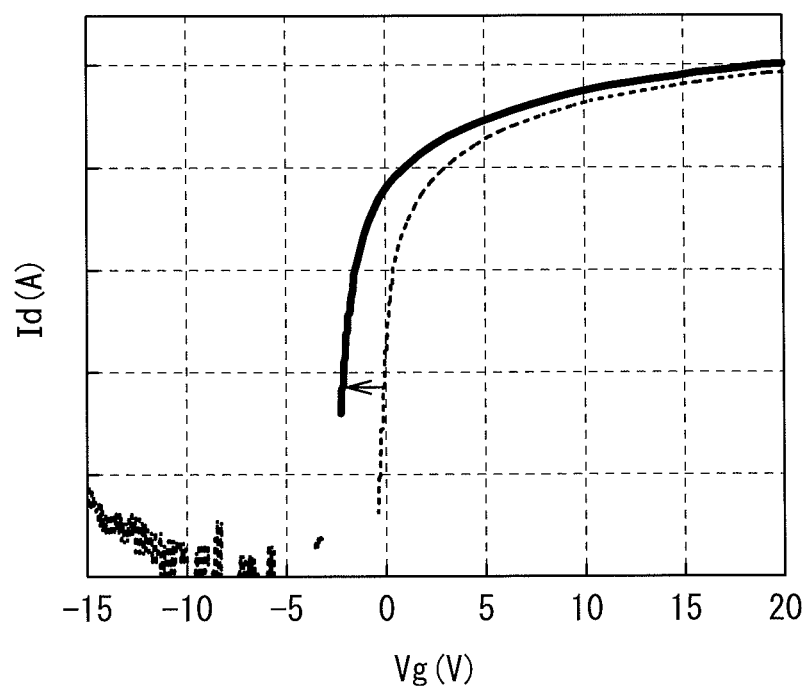
FIG. 2 is a diagram for describing characteristics of an oxide semiconductor.

The source electrode 17T may be configured of only the low-resistance electrode layer 17TA. However, when the low-resistance electrode layer 17TA is provided on the semiconductor layer 14T with the transparent electrode layer 16TA in between, stable transistor characteristics are achieved. It is known that when an oxide semiconductor, which is the material configuring the semiconductor layer 14T, reacts with oxygen, hydrogen, or moisture in the atmosphere, its characteristics greatly vary. For example, as illustrated in FIG. 2, even when an oxide semiconductor is exposed to the atmosphere for only three days, its transistor characteristics are varied from the broken line to the solid line. In order to prevent such variation of transistor characteristics, a method is proposed in which the surface of a transistor is covered with a silicon oxide film, a silicon nitride film, an aluminum oxide film, or the like for protection. However, the oxide semiconductor (semiconductor layer) is in contact with not only the atmosphere, but also a drain electrode and a source electrode, the redox reaction on the contact face thereof influences the characteristics. Accordingly, if the drain electrode and the source electrode have configurations different from each other, there is a possibility that the transistor characteristics become unstable. While, in the transistor Tr1 of the present embodiment, the drain electrode 16T and the source electrode 17T have configurations different from each other, the semiconductor layer 14T is in contact with the first conducting film 16 (the drain electrode 16T and the transparent electrode layer 16TA). As a result, oxygen is sufficiently supplied from the first conducting film 16 (transparent conductive oxide film) to the semiconductor layer 14T, and thus stable transistor characteristics are achieved.

Figure 3:
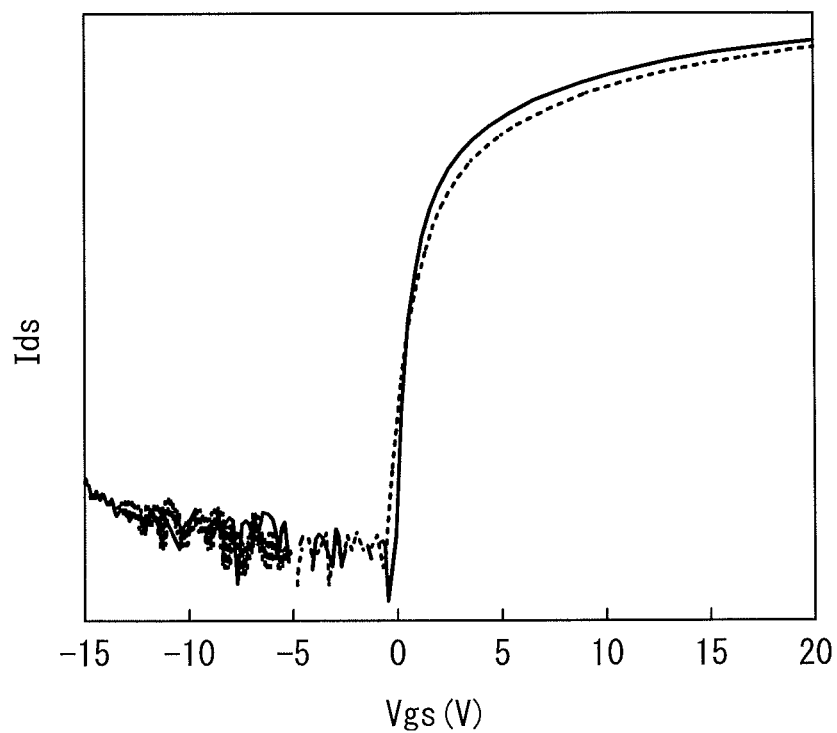
FIG. 3 is a diagram for describing characteristics of a transparent conductive oxide film.

FIG. 3 shows transistor characteristics in the case where the semiconductor layer 14T and the low-resistance electrode layer 17TA are directly connected (broken line) and transistor characteristics in the case where the semiconductor layer 14T and the low-resistance electrode layer 17TA are connected through the transparent electrode layer 16TA (solid line). In the case where the transparent electrode layer 16TA is interposed, the rising at the time of application of current is steep, whereas in the case where the low-resistance electrode layer 17TA is directly connected to the semiconductor layer 14T, the rising at the time of application of current is gradual, thereby deteriorating switching characteristics. In other words, when the source electrode 17T has a structure in which the transparent electrode layer 16TA and the low-resistance electrode layer 17TA are laminated, favorable transistor characteristics are achieved.

(Wiring Layer 17W)

Depending on the wiring layout, the wiring layer 17W (the signal line 120) is disposed in a selected region on the substrate 11. The wiring layer 17W has a configuration in which a transparent wiring layer 16WA and a low-resistance wiring layer 17WA are laminated in this order from the substrate 11 side. The transparent wiring layer 16WA and the low-resistance wiring layer 17WA are configured of the first conducting film 16 and the second conducting film 17, respectively. With the low-resistance wiring layer 17WA, the resistance of the signal line 120 is stabilized, and favorable electrical characteristics are achieved. It is to be noted that, "a conductive material configuring part or whole of the wiring layer" of the present application corresponds to the material configuring the second conducting film 17.

(Capacitor Cs)

A capacitor Cs is a capacitive element that holds electric charge corresponding to an image signal, and includes, from the substrate 11 side, a lower electrode 12C, a capacitor insulating film 13C, and an upper electrode 16C in this order. The lower electrode 12C and the upper electrode 16C are configured of the third conducting film 12 and the first conducting film 16, respectively. The lower electrode 12C is provided in a selective region and separated from the transistor Tr1 (the gate electrode 12T).

The display device 1 is manufactured as described below, for example.

Figure 4A:
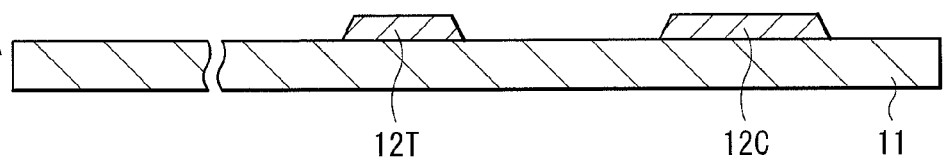
FIGS. 4A to 4C are sectional views showing a method of manufacturing the display device illustrated in FIG. 1 in the order of processes.
Figure 4B:
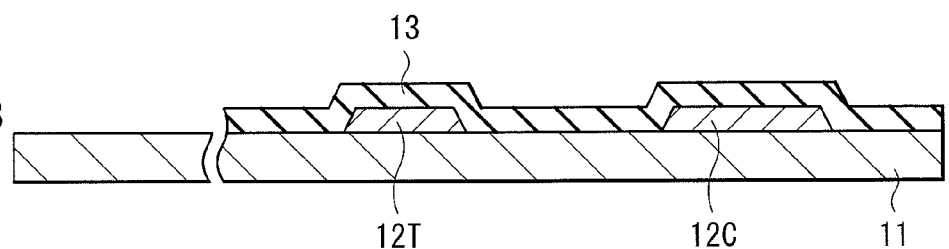

FIGS. 4A to 7C show a method of manufacturing the display device 1 in the order of the processes. First, the third conducting film 12 made of the above-described material is formed on the entire face of the substrate 11 by, for example, a sputtering method or a CVD (chemical vapor deposition) method, and thereafter, patterning is performed by photolithography to form the gate electrode 12T of the transistor Tr1 and the lower electrode 12C of the capacitor Cs (FIG. 4A). Next, as illustrated in FIG. 4B, an insulating film 13 which is a laminated film of a silicon nitride film and a silicon oxide film is formed on the entire face of the substrate 11, the gate electrode 12T, and the lower electrode 12C by a plasma CVD method, for example. Specifically, the silicon nitride film is formed with use of gas of silane, ammonia ($NH_3$), nitrogen ($N_2$), or the like as a source gas for example, and thereafter the silicon oxide film is formed with use of gas including silane, dinitrogen monoxide, and the like as a source gas for example, in order to prepare the insulating film 13. Alternatively, in place of the plasma CVD method, the sputtering method may be adopted to form the insulating film 13 configured of a silicon nitride film, a silicon oxide film, an aluminum oxide film or an aluminum nitride film. The sputtering method is a method of forming a silicon oxide film, a silicon nitride film, and the like, by, with use of silicon as a target, for example, supplying oxygen, water vapor, nitrogen, or the like in discharge atmosphere of sputtering to perform reactive plasma sputtering. The insulating film 13 configures the gate insulating film 13T and the capacitor insulating film 13C.

Figure 4C:
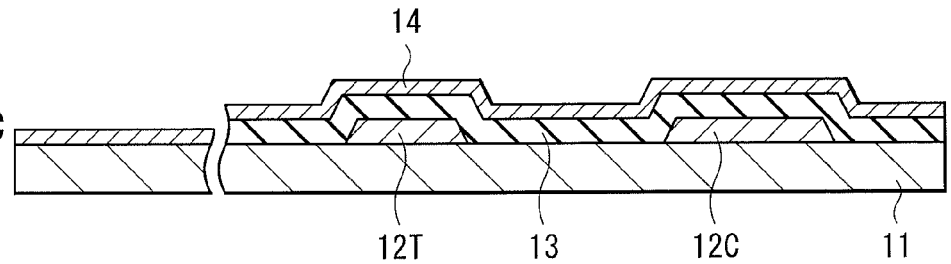

After the insulating film 13 is formed, a semiconductor film 14 made of, for example, IGZO is formed on the insulating film 13 by, for example, a DC (direct current) sputtering method as illustrated in FIG. 4C. In the DC sputtering method, plasma discharge using mixed gas of argon (Ar) and oxygen is performed with use of a ceramic of IGZO as a target. Argon and oxygen are introduced after evacuation is performed until the vacuum degree in a vacuum vessel becomes $1 \times 10^{-4\ Pa}$ or less. In addition, for example, it is also possible to form the semiconductor film 14 made of zinc oxide by an RF (radio frequency; high frequency) sputtering method with use of a ceramic of zinc oxide as a target. It is also possible to form the semiconductor film 14 made of zinc oxide by a sputtering method using DC power in a gas atmosphere containing argon and oxygen with use of a metal target of zinc. By varying the flow ratio of argon and oxygen, it is possible to control the carrier density in the semiconductor layer 14T of the transistor Tr1.

After the semiconductor film 14 is provided, a protective film 15 configured of a silicon oxide film or a silicon nitride film is formed as illustrated in FIG. 5A. Next, this protective film 15 is patterned by photolithography and etching (FIG. 5B) to form the channel protective layer 15T. After the channel protective layer 15T is formed, the insulating film 13 is patterned in advance for a contact with the gate electrode 12T. Next, as illustrated in FIG. 5C, the semiconductor film 14 is patterned to form the semiconductor layer 14T. The semiconductor film 14 is patterned by photolithography and etching similarly to the case of the protective film 15. Since an oxide semiconductor film is readily dissolved in acid solution and alkali solution, wet etching is generally used, but dry etching may also be adopted.

In the case where the semiconductor layer 14T is configured by a crystalline oxide semiconductor, it is possible to form the semiconductor film 14 in a crystalline state, but it is also possible that the semiconductor film 14 in an amorphous state is formed and patterned as mentioned above, and thereafter, a crystallization annealing treatment such as heat treatment in a batch furnace or the like is performed on the semiconductor film 14. As the crystalline material, it suffices to use those made of zinc oxide, indium, gallium, zirconium, tin, and the like in which the ratio of indium or tin is increased.

Figure 6A:
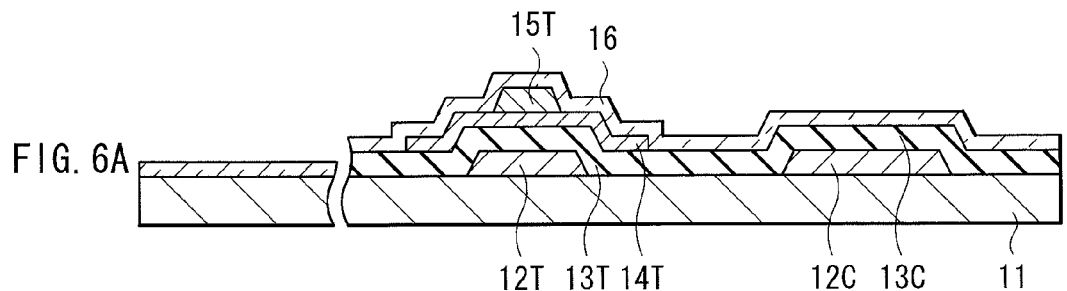
FIGS. 6A to 6C are sectional views showing processes subsequent to FIG. 5C.
Figure 6B:
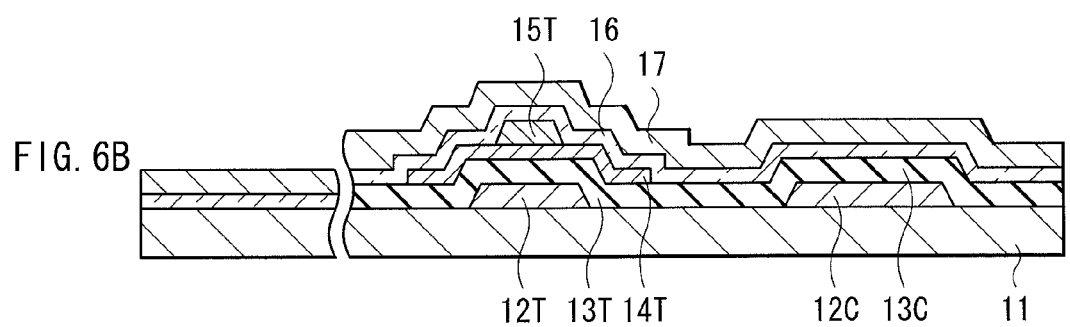
Figure 6C:
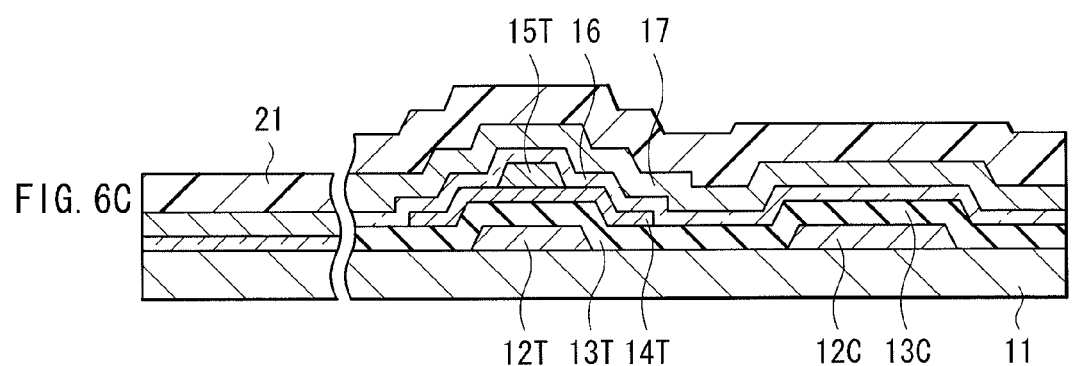

After the semiconductor layer 14T is provided, the first conducting film 16 made of ITO is formed on the entire face of the substrate 11, the gate insulating film 13T, the capacitor insulating film 13C, the semiconductor layer 14T, and the channel protective layer 15T by, for example, the sputtering method as illustrated in FIG. 6A. Next, as illustrated in FIG. 6B, the second conducting film 17 configured of, for example, an aluminum film is formed on the entire face of the first conducting film 16.

Figure 7A:
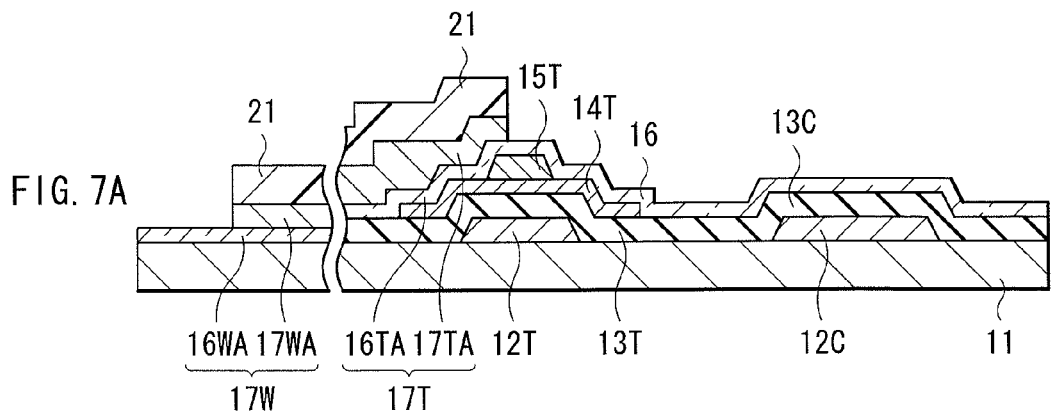
FIGS. 7A to 7C are sectional views showing processes subsequent to FIG. 6C.
Figure 7B:
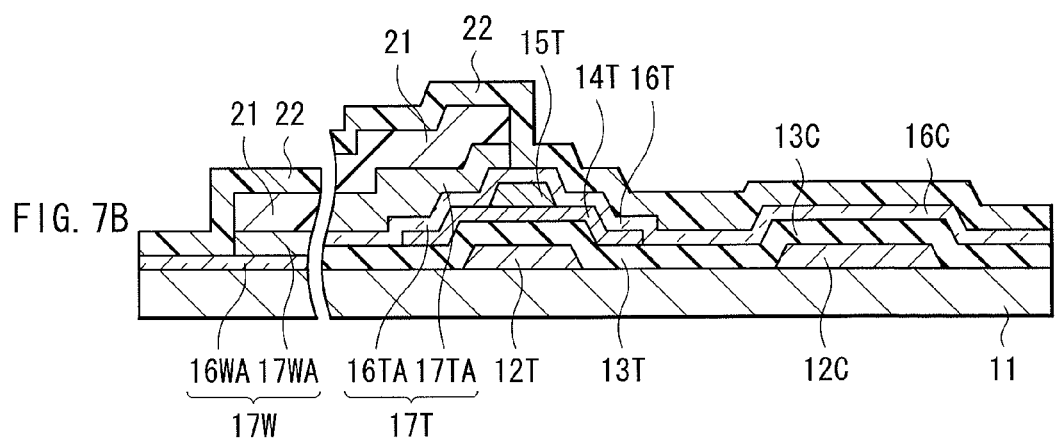
Figure 7C:
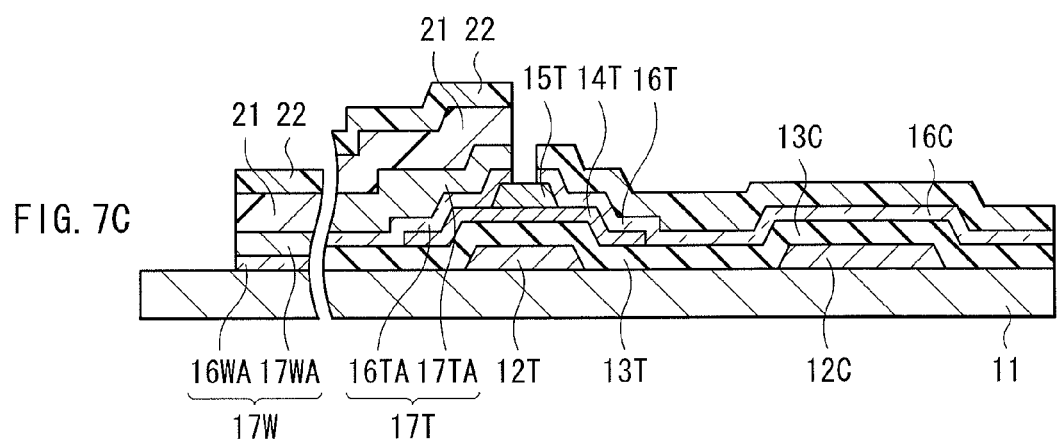

After the second conducting film 17 is provided, the first resist layer 21 is formed on the second conducting film 17 (FIG. 6C), and from the second conducting film 17, the source electrode 17T, the low-resistance electrode layer 17TA serving as a part of the wiring layer 17W, and the low-resistance wiring layer 17WA are formed by photolithography and etching (FIG. 7A). As the etching for the second conducting film 17, wet etching using mixed solution containing, for example, phosphoric acid, nitric acid, and acetic acid, or dry etching using gas such as chlorinated gas and fluorocarbon is performed. If the first conducting film 16 is exposed from the surfaces of the source electrode 17T and the wiring layer 17W due to excessive etching of the second conducting film 17, etching speed is increased. In order to prevent this, for example, a molybdenum film or a titanium film having a film thickness of 100 nm or more is preferably provided between the first conducting film 16 and the second conducting film 17. Etching may also be performed such that the etching amount of the channel protective layer 15T is 50 nm or less. After the second conducting film 17 is patterned, a second resist layer 22 is provided (FIG. 7B), and from the first conducting film 16, the drain electrode 16T, the transparent electrode layer 16TA (the source electrode 17T), the transparent wiring layer 16WA (the wiring layer 17W), and the upper electrode 16C are formed (FIG. 7C). After the first conducting film 16 is patterned, the first resist layer 21 and the second resist layer 22 are removed, and thus the transistor Tr1, the wiring layer 17W, and the capacitor Cs illustrated in FIG. 1 are completed. After the driving circuit including the transistor Tr1, the wiring layer 17W, and the capacitor Cs, is formed as described above, organic EL devices are further formed to manufacture the display device 1. In the present embodiment, with the low-resistance electrode layer 17TA and the low-resistance wiring layer 17WA formed from the second conducting film 17, the occurrence of electrolytic corrosion between the source electrode 17T and the wiring layer 17W is suppressed. Below, this will be described based on a comparative example.

Figure 8A:
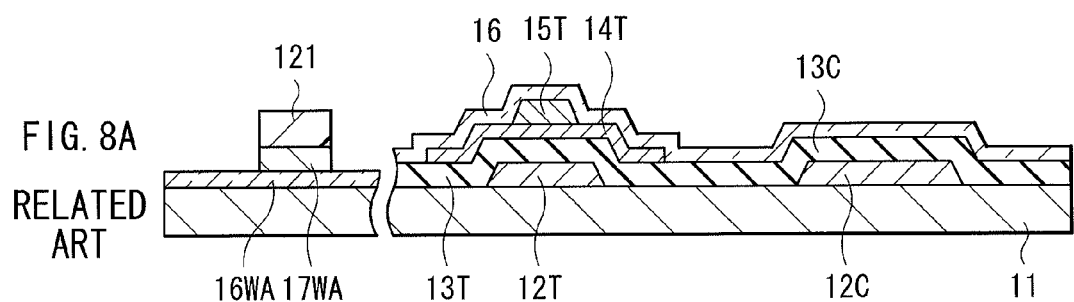
FIGS. 8A to 8C are sectional views showing a method of manufacturing a display device according to a comparative example.
Figure 8B:
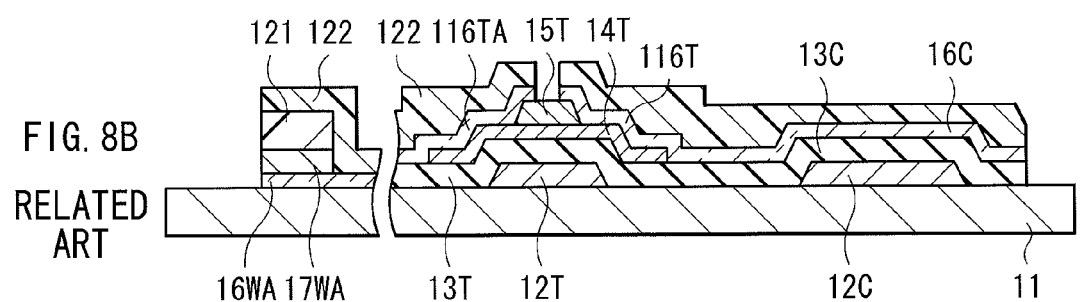
Figure 8C:
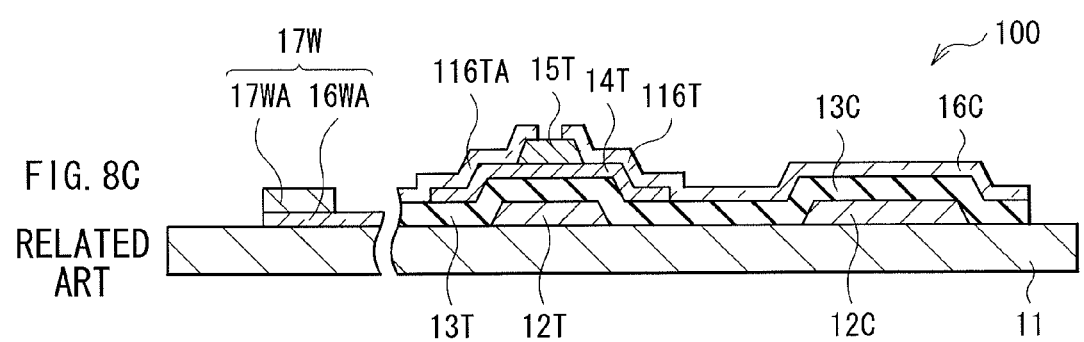
Figure 9:
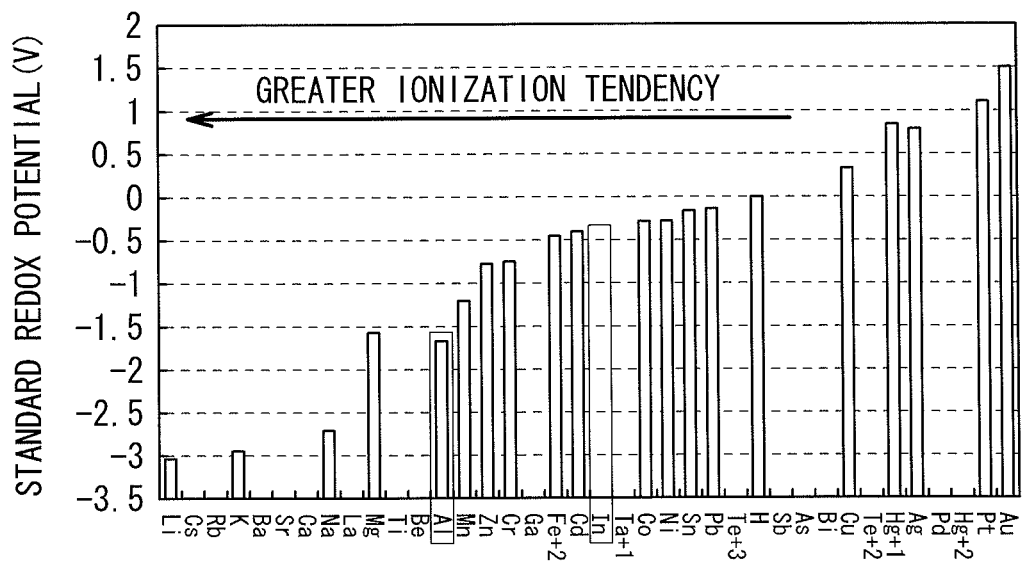
FIG. 9 is a diagram used to describe ionization tendencies of various metals.

FIGS. 8A to 8C show a method of manufacturing a display device (a display device 100) according to a comparative example in the order of processes. As illustrated in FIG. 8A, in the display device 100, only the low-resistance wiring layer 17WA of the wiring layer 17W is formed from the second conducting film 17, and a source electrode 116TA is not provided with a low-resistance electrode layer. After a low-resistance wiring layer 17W is formed from the second conducting film 17, the first conducting film 16 is patterned to form a drain electrode 116T, the source electrode 116TA, the transparent wiring layer 16WA, and the upper electrode 16C (FIG. 8B). Next, as illustrated in FIG. 8C, the first resist layer 121 and a second resist layer 122 which have been used to pattern the second conducting film 17 and the first conducting film 16 are removed by a resist remover. At this time, since the source electrode 116TA is not provided with the low-resistance electrode layer in the display device 100, electrolytic corrosion may occur between the source electrode 116TA and the wiring layer 17W electrically connected to each other. This electrolytic corrosion occurs such that, if the source electrode 116TA and the low-resistance wiring layer 17WA on the surface of the wiring layer 17W which greatly differ in ionization tendency from each other exist in a resist remover containing ions in an electrically-connected state, then the low-resistance wiring layer 17WA having a greater ionization tendency is dissolved, and corroded. FIG. 9 shows ionization tendencies of various metals. When the first conducting film 16 and the second conducting film 17 are configured of, for example, an ITO film and an aluminum film, respectively, since the standard redox potential of indium and aluminum are −0.3382(V) and −1.676(V), respectively, their ionization tendencies are greatly different from each other, and the aluminum film having a greater ionization tendency is dissolved. With the corrosion of the wiring layer 17W, the resistance becomes unstable, and the electrical characteristics of the display device 100 deteriorate.

Meanwhile, in the display device 1 of the present embodiment, from the second conducting film 17, the low-resistance electrode layer 17TA of the source electrode 17T is formed in addition to the low-resistance wiring layer 17WA as illustrated in FIG. 7A. As a result, at the time of removing the first resist layer 21 and the second resist layer 22, since the material configuring the low-resistance wiring layer 17WA and the low-resistance electrode layer 17TA are the same material (the second conducting film 17), there is no difference in ionization tendency, and no electrolytic corrosion occurs even when the wiring layer 17W and the source electrode 17T are immersed in the resist remover. In other words, since the low-resistance electrode layer 17TA is provided on the surface of the source electrode 17T, the transparent electrode layer 16TA having an ionization tendency greatly different from that of the low-resistance wiring layer 17WA is not exposed to the resist remover. In this way, with the low-resistance electrode layer 17TA, it is possible to prevent electrolytic corrosion from occurring and to achieve stable electrical characteristics. While the low-resistance wiring layer 17WA and the low-resistance electrode layer 17TA are configured of the same conducting film (the second conducting film 17) in the present embodiment, the low-resistance wiring layer 17WA and the low-resistance electrode layer 17TA may also be configured of conducting films different from each other if the ionization tendencies of the conducting films are close to each other.

Figure 10:
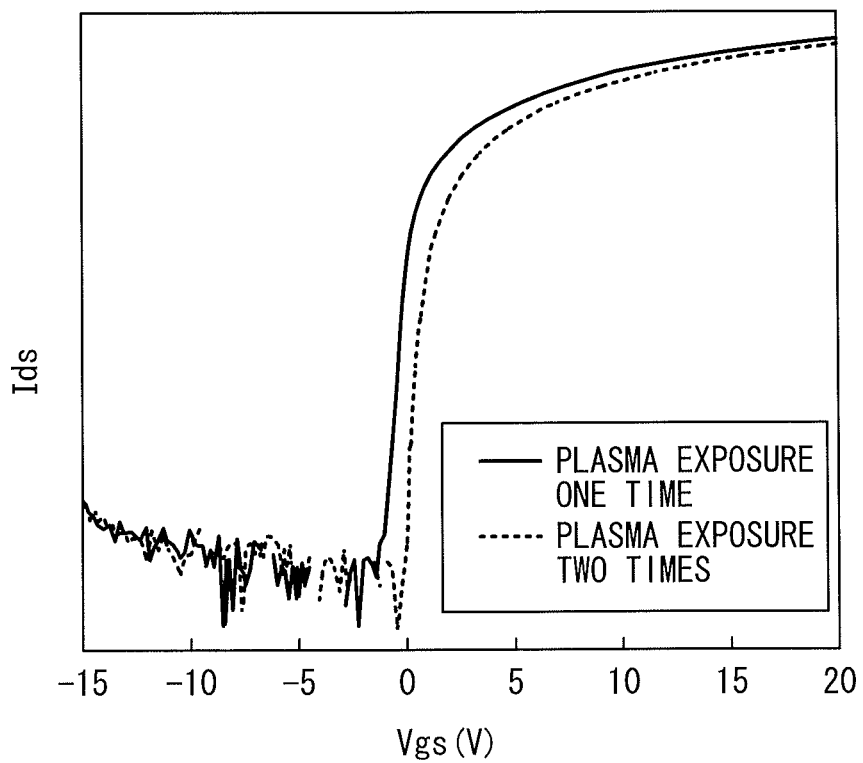
FIG. 10 is a diagram showing characteristics of a thin film transistor manufactured by a method illustrated in FIG. 7A to 7C.

It is also possible to form the transparent electrode layer 16TA and the low-resistance electrode layer 17TA by forming and patterning of the first conducting film 16 and forming and patterning of the second conducting film 17 which are performed in the mentioned order. However, if the transparent electrode layer 16TA and the low-resistance electrode layer 17TA are formed by this method, then the semiconductor layer 14T is exposed to plasma in etching two times, and therefore the transistor characteristics may deteriorate. As illustrated in FIG. 10, the more times the semiconductor layer 14T is exposed to the plasma of etching, the more the switching characteristics deteriorate, and the rising thereof becomes gradual. The solid line and the broken line in FIG. 10 show the transistor characteristics of the semiconductor layer 14T exposed to plasma one time and two times, respectively.

Consequently, as illustrated in FIG. 6A and FIG. 6B, it is preferable to form the first conducting film 16 and the second conducting film 17, each in a form of a solid film, in this order, and then pattern the second conducting film 17 and the first conducting film 16 (FIG. 7A and FIG. 7C). This is because, at the time of etching the second conducting film 17, the second conducting film 17 protects the semiconductor layer 14T to suppress degradation of the semiconductor layer 14T.

In addition, it is also possible that, after the first resist layer 21 (FIG. 7A) which has been used to pattern the second conducting film 17 is removed, the second resist layer 22 is provided. However, in this case, since the first conducting film 16 in a form of solid film, and the side faces of the low-resistance electrode layer 17TA and the low-resistance wiring layer 17WA are immersed in the resist remover for removing the first resist layer 21, the low-resistance wiring layer 17WA may be corroded to raise the electric resistance. For this reason, it is preferable to provide the second resist layer 22 without removing the first resist layer 21.

In the display device 1, a scanning signal is supplied from the scan line 130 to each organic EL device through the gate electrode 12T of the transistor Tr1, and an image signal from the signal line 120 (the wiring layer 17W) is held in the capacitor Cs through the source electrode 17T of the transistor Tr1. In other words, a transistor Tr2 is turned on or off based on the signal held in the capacitor Cs, and as a result, a driving current is injected to the organic EL device. In the transistors Tr1 and Tr2, when a voltage (gate voltage) at a level equal to or greater than a threshold voltage is applied to the gate electrode, a current (drain current) is generated in a channel region of the semiconductor layer between the source electrode and the drain electrode, and driving is performed as described above.

In this case, since the low-resistance electrode layer 17TA configured of the same conducting film (the second conducting film 17) as that of the low-resistance wiring layer 17WA of the wiring layer 17W is provided on the front side of the source electrode 17T, the occurrence of the electrolytic corrosion between the source electrode 17T and the wiring layer 17W is suppressed at the time of manufacture. Consequently, the electrical characteristics of the display device 1 are stabilized.

As described above, since, in the display device 1 of the present embodiment, the source electrode 17T is provided with the low-resistance electrode layer 17TA, the electrolytic corrosion between the source electrode 17T and the wiring layer 17W is prevented from occurring, and stable electrical characteristics are achieved.

It is to be noted that, while the low-resistance electrode layer 17TA and the low-resistance wiring layer 17WA are preferably configured of the same conducting film, electrolytic corrosion is suppressed even if they are configured of films different from each other as long as the difference in ionization tendency between them is smaller than the difference in ionization tendency between the transparent electrode layer 16TA and the low-resistance wiring layer 17WA.

The display device 1 may be incorporated in electronic units described below in application examples 1 to 5, for example.

Application Example 1

Figure 11:
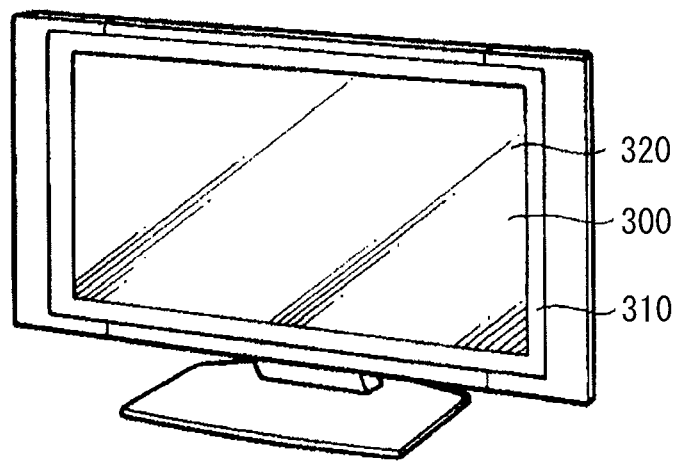
FIG. 11 is a perspective view showing an external appearance of application example 1.

FIG. 11 shows an external appearance of a television. This television includes, for example, an image display screen section 300 including a front panel 310 and a filter glass 320.

Application Example 2

Figure 12A:
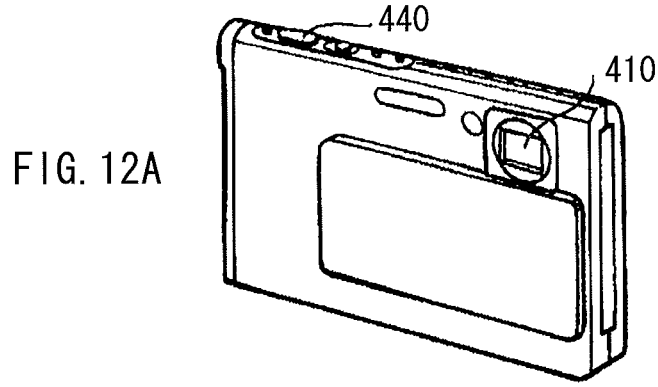
FIG. 12A is a perspective view showing an external appearance of application example 2 as viewed from a front side.
Figure 12B:
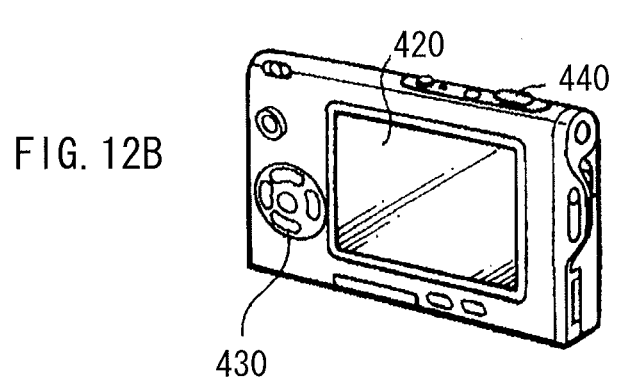
FIG. 12B is a perspective view showing an external appearance of application example 2 as viewed from a rear side.

FIGS. 12A and 12B each show an external appearance of a digital still camera. This digital still camera includes, for example, a light emitting section 410 for generating flash light, a display section 420, a menu switch 430, and a shutter button 440.

Application Example 3

Figure 13:
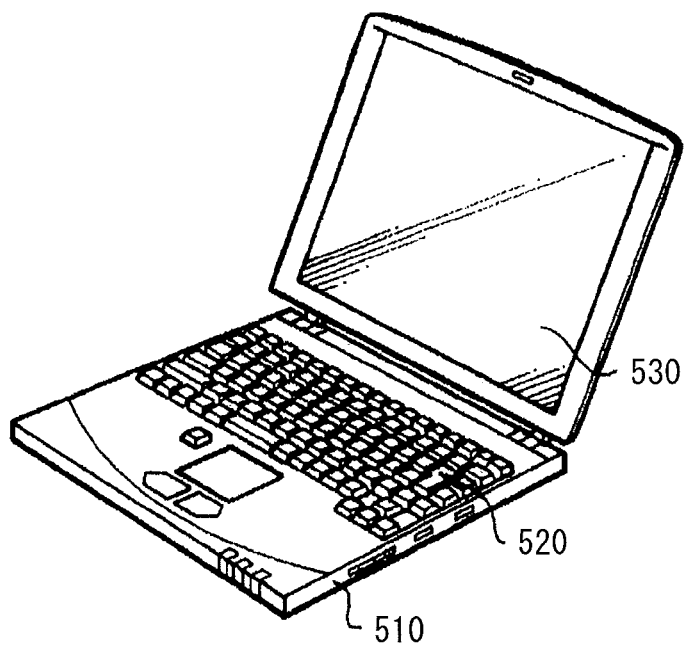
FIG. 13 is a perspective view showing an external appearance of application example 3.

FIG. 13 shows an external appearance of a notebook personal computer. This notebook personal computer includes, for example, a main body 510, a keyboard 520 used to input characters and the like, and a display section 530 that displays an image.

Application Example 4

Figure 14:
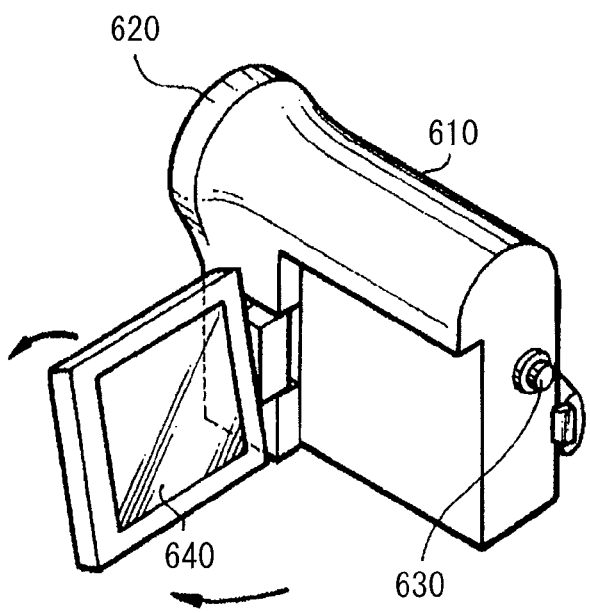
FIG. 14 is a perspective view showing an external appearance of application example 4.

FIG. 14 shows an external appearance of a video camcorder. This video camcorder includes, for example, a main body section 610, a lens 620 provided on the front side of the main body section 610 for taking an image of a subject, a start/stop switch 630 for capturing an image, and a display section 640.

Application Example 5

FIGS. 15A to 15G each show an external appearance of a mobile phone. This mobile phone includes, for example, a coupling section (hinge section) 730 coupling an upper side housing 710 and a lower side housing 720, a display 740, a sub-display 750, a picture light 760, and a camera 770.

Hereinabove, while the present application is described based on the embodiment, the present application is not limited to the above-mentioned embodiment, and various modifications may be made. For example, the material and thickness of the layers, the methods of forming the films, the film formation conditions, and the like described in the embodiment are not limitative, and other materials and thicknesses, other methods of forming the films, and other film formation conditions may also be adopted.

In addition, while the source electrode 17T of the transistor Tr1 is connected to the wiring layer 17W in the above-mentioned embodiment, the drain electrode may alternatively be connected thereto. Further, while the transistor Tr1 has the bottom-gate type structure in the above-mentioned embodiment, a transistor having a top-gate type structure is also applicable. Additionally, while the wiring layer and the transistor of the present application are respectively the signal line 120 and the transistor Tr1 in the above-mentioned embodiment, other wiring layers and transistors are also applicable.

Furthermore, the present application is applicable to other display devices such as a liquid crystal display device, an inorganic electroluminescence display device, an electrodeposition type display device, and an electrochromic type display device, other than the organic EL display device.

It is to be noted that the present disclosure may have the following configurations.

(1) A display device including:
a thin film transistor; and
a wiring layer;
the thin film transistor including
a control electrode,
a semiconductor layer facing the control electrode,
a first electrode made of a light transmissive material and electrically connected to the semiconductor layer, and
a second electrode including a metal film having resistance lower than that of the light transmissive material, the second electrode being electrically connected to each of the semiconductor layer and the wiring layer, wherein
a difference in ionization tendency between a material configuring the metal film and a conductive material configuring a part or whole of the wiring layer is smaller than a difference in ionization tendency between the light transmissive material and the conductive material.

(2) The display device according to (1), wherein the conductive material and the material configuring the metal film are the same material.

(3) The display device according to (1) or (2), wherein the metal film of the second electrode is laminated on a film made of the light transmissive material, and
the wiring layer includes a film made of the light transmissive material, and a film made of the conductive material laminated on the film made of the light transmissive material.

(4) The display device according to any one of (1) to (3), wherein
the light transmissive material is ITO (indium-tin-oxide), and
the metal film is an aluminum (Al) film.

(5) The display device according to any one of (1) to (4), wherein the semiconductor layer is configured of an oxide semiconductor.

(6) A method of manufacturing a display device, the method including forming a thin film transistor and a wiring layer, the forming of a thin film transistor including:
providing a control electrode and a semiconductor layer facing the control electrode;
providing a first electrode made of a light transmissive material and electrically connected to the semiconductor layer; and
forming a second electrode by forming a metal film having resistance lower than that of the light transmissive material such that the metal film is electrically connected to the semiconductor layer and the wiring layer, and thereafter patterning the metal film, wherein
a difference in ionization tendency between a material configuring the metal film and a conductive material configuring a part or whole of the wiring layer is smaller than a difference in ionization tendency between the light transmissive material and the conductive material.

(7) The method of manufacturing a display device according to (6), wherein, during the forming of the second electrode, a film made of the light transmissive material and the metal film are sequentially formed in this order, and thereafter the film made of the light transmissive material and the metal film are patterned.

(8) The method of manufacturing a display device according to (7), wherein, during the patterning of the film made of the light transmissive material and the metal film, a first resist layer is provided on the metal film to pattern the metal film, and after the metal film is patterned, a second resist layer is formed on the first resist layer to pattern the film made of the light transmissive material.

(9) An electronic unit with a display device, the display device including:
a thin film transistor; and
a wiring layer;
the thin film transistor including
a control electrode,
a semiconductor layer facing the control electrode,
a first electrode made of a light transmissive material and electrically connected to the semiconductor layer, and
a second electrode including a metal film having resistance lower than that of the light transmissive material, the second electrode being electrically connected to each of the semiconductor layer and the wiring layer, wherein
a difference in ionization tendency between a material configuring the metal film and a conductive material configuring a part or whole of the wiring layer is smaller than a difference in ionization tendency between the light transmissive material and the conductive material.

The present application claims priority to Japanese Priority Patent Application JP 2011-222879 filed in the Japan Patent Office on Oct. 7, 2011, the entire content of which is hereby incorporated by reference.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
a thin film transistor; and
a wiring layer;
the thin film transistor including
a control electrode,
a semiconductor layer facing the control electrode,
a first electrode made only of a light transmissive material and electrically connected to the semiconductor layer, and
a second electrode including a metal film and the light transmissive material, the metal film having resistance lower than that of the light transmissive material, the second electrode being electrically connected to each of the semiconductor layer and the wiring layer, wherein
a difference in ionization tendency between a material configuring the metal film and a conductive material configuring a part or whole of the wiring layer is smaller than a difference in ionization tendency between the light transmissive material and the conductive material.

2. The display device according to claim 1, wherein the conductive material and the material configuring the metal film are the same material.

3. The display device according to claim 1, wherein
the metal film of the second electrode is laminated on a film made of the light transmissive material, and
the wiring layer includes a film made of the light transmissive material, and a film made of the conductive material laminated on the film made of the light transmissive material.

4. The display device according to claim 1, wherein
the light transmissive material is ITO (indium-tin-oxide), and
the metal film is an aluminum (Al) film.

5. The display device according to claim 1, wherein the semiconductor layer is configured of an oxide semiconductor.

6. A method of manufacturing a display device, the method including forming a thin film transistor and a wiring layer, the forming of a thin film transistor comprising:
providing a control electrode and a semiconductor layer facing the control electrode;
providing a first electrode made only of a light transmissive material and electrically connected to the semiconductor layer; and
forming a second electrode by forming a metal film and the light transmissive material, the metal film having resistance lower than that of the light transmissive material, the metal film being electrically connected to the wiring layer and the light transmissive material being electrically connected to the semiconductor layer, and thereafter patterning the metal film, wherein
a difference in ionization tendency between a material configuring the metal film and a conductive material configuring a part or whole of the wiring layer is smaller than a difference in ionization tendency between the light transmissive material and the conductive material.

7. The method of manufacturing a display device according to claim 6, wherein, during the forming of the second electrode, a film made of the light transmissive material and the metal film are sequentially formed in this order, and thereafter the film made of the light transmissive material and the metal film are patterned.

8. The method of manufacturing a display device according to claim 7, wherein, during the patterning of the film made of the light transmissive material and the metal film, a first resist layer is provided on the metal film to pattern the metal film, and after the metal film is patterned, a second resist layer is formed on the first resist layer to pattern the film made of the light transmissive material.

9. An electronic unit with a display device, the display device comprising:
a thin film transistor; and
a wiring layer;
the thin film transistor including
a control electrode,
a semiconductor layer facing the control electrode,
a first electrode made only of a light transmissive material and electrically connected to the semiconductor layer, and
a second electrode including a metal film and the light transmissive material, the metal film having resistance lower than that of the light transmissive material, the second electrode being electrically connected to each of the semiconductor layer and the wiring layer, wherein
a difference in ionization tendency between a material configuring the metal film and a conductive material configuring a part or whole of the wiring layer is smaller than a difference in ionization tendency between the light transmissive material and the conductive material.

10. The display device according to claim 3, wherein the wiring layer includes at least one of a signal line, a scan line, and a power line.

11. The display device according to claim 1, wherein the wiring layer includes:
the light transmissive material disposed upon a substrate,
the metal film laminated upon the light transmissive layer, and
the conductive material connected to the metal film.

12. The display device according to claim 1, wherein the first electrode includes a drain of the thin film transistor and the second electrode includes a source of the thin film transistor.

13. The display device according to claim 1, wherein the first electrode includes a source of the thin film transistor and the second electrode includes a drain of the thin film transistor.

* * * * *